United States Patent
Ort et al.

(10) Patent No.: US 6,879,144 B2
(45) Date of Patent: Apr. 12, 2005

(54) COLOR CODE ALPHANUMERIC SYSTEM FOR IDENTIFYING COMPONENTS OF A PROXIMITY MEASUREMENT SYSTEM

(76) Inventors: Gene P. Ort, 6411 Fawnwood Dr., Spring, TX (US) 77389; Quentin J. Bach, 8002 Stroud, Houston, TX (US) 77036

( * ) Notice: Subject to any disclaimer, the term of this patent is extended or adjusted under 35 U.S.C. 154(b) by 190 days.

(21) Appl. No.: 10/342,754

(22) Filed: Jan. 15, 2003

(65) Prior Publication Data

US 2004/0135587 A1 Jul. 15, 2004

(51) Int. Cl.[7] .................. G01R 31/02; G01R 27/26; G01B 7/14
(52) U.S. Cl. .................. 324/72.5; 324/662; 324/66; 324/207.26
(58) Field of Search .................. 324/72.5, 66, 662, 324/207.16, 207.26, 754

(56) References Cited

U.S. PATENT DOCUMENTS

| | | | | |
|---|---|---|---|---|
| 4,027,236 A | * | 5/1977 | Stewart | 324/556 |
| 4,132,946 A | * | 1/1979 | Holdren et al. | 324/72.5 |
| 4,229,887 A | * | 10/1980 | Lukits | 434/224 |
| 5,280,251 A | * | 1/1994 | Strangio | 324/539 |
| 6,650,111 B2 | * | 11/2003 | Christensen | 324/207.26 |

* cited by examiner

Primary Examiner—Anjan K. Deb

(57) ABSTRACT

An identification and organization system using color coding and alphanumeric labels for matching components of a proximity measurement system includes: (1) a color code system to identify the type or series of proximity probe used with the proximity measurement system, and (2) an alphanumeric labeling system to identify the system length (i.e., the length of the extension cable plus the length of the proximity probe). Installation and maintenance of proximity measurement systems can be more reliably performed by the color code and alphanumeric labeling system.

5 Claims, 4 Drawing Sheets

COLOR CODE ALPHANUMERIC SYSTEM FOR IDENTIFYING COMPONENTS OF A PROXIMITY MEASUREMENT SYSTEM

BACKGROUND OF THE INVENTION

1. Field of the Invention

The present invention relates to proximity probes which are used in machine health monitoring operations, and, more particularly, to an identification and organization system using color codes and alphanumeric labels for matching proximity probes and probe extension cables with the appropriate electronic driver or transmitter device during installation.

2. Description of the Prior Art

Proximity probes are used for monitoring the health of plant critical sleeve bearing machines, such as centrifugal pumps, turbo compressors, steam turbines, fans, blowers, gear boxes, generators, and electric motors. Monitoring machine health helps to predict critical machine failures by detecting out-of-alignment or axial rub conditions where the shaft contacts the bearing surface. By detecting these conditions before they become catastrophic, costly downtime of the machine and personal injury to machine operators can be avoided.

A proximity probe comprises a mounting body with a sensing tip on one end and a probe cable having a predetermined length on the other end. The proximity probe is mounted to a sleeve bearing machine such that the sensing tip can observe the rotation of the shaft with respect to the bearing surface. The probe is mounted to the bearing either through a tapped hole in the bearing surface or by means of a mounting bracket. The probe cable connects to an extension cable which also has a predetermined length. The extension cable is used to connect the proximity probe to a driver or alternatively to a transmitter having an integral driver built-in. When installed properly, the proximity measurement system provides sufficient measuring planes needed for external display of the shaft's rotation on diagnostic equipment.

A proximity probe, extension cable, and driver or transmitter make up a proximity measurement system. In operation, a plurality of proximity probes are utilized in the proximity measurement system to monitor the shaft of the sleeve bearing machine from a number of reference or phase angles. The proximity measurement system generates an electromagnetic field and detects changes in the magnetic field caused when an object approaches the sensing tip of the proximity probe. When an object (e.g., the shaft of a bearing machine) approaches the sensing tip, the capacitance of the system increases. Thus, by measuring the output capacitance of the system, the proximity of the approaching object can be measured with respect to the sensing tip of the probe.

In operation, the capacitance of the proximity measurement system is effected by the total length of the proximity measurement system (i.e., the length of the probe plus the length of the extension cable). Therefore, since the proximity measurement system is capacitance-critical, the total system length must be matched with the appropriate electronic driver or transmitter.

Moreover, there are different types of probes in use today which reflect a particular machine monitoring product design. Each type of probe is distinguished by a "series" designation. As a proximity probe design is changed or "redesigned" over time, it is given a new series designation to differentiate it from its predecessor. Standard probe series designations include "3000", "3300", "7200", and "RAM".

While proximity probes are excellent for monitoring machines for out-of-alignment or surface rub conditions, problems have been observed with installation and maintenance of proximity probes. Particularly, users and installers of capacitance-critical proximity measurement systems have had difficulty with matching the probe with the proper extension cable and driver or transmitter during installation. If the components are not properly matched (by series and by total system length), the system will not function properly.

Accordingly, it would be desirable to have a system of identifying and organizing the electronic components of the proximity measurement system (i.e., proximity probe, proximity probe extension cable, and drivers or transmitter) such that the proper components can be easily matched during installation and maintenance operations. This novel and useful result has been achieved by the present invention.

SUMMARY OF THE INVENTION

In accordance with the present invention, an identification and organization system using color coding and alphanumeric labels for matching components of a proximity measurement system is provided. Particularly, the system is used to match a proximity probe and an extension cable to an electronic driver or transmitter device.

One object of the present invention is to provide a color code system to identify the series of the probe used in the proximity measurement system. The particular type of probe used in the proximity measurement system must match the probe extension cable and the electronic driver or transmitter device.

Another object of the present invention is to provide an alphanumeric labeling system to identify the length of the extension cable and the length of the proximity probe such that the total system length can be determined and matched to the appropriate electronic driver or transmitter device.

DESCRIPTION OF SPECIFIC EMBODIMENTS OF THE INVENTION

In machine health monitoring operations, a proximity measurement system is used to observe the shaft of a sleeve bearing machine and to detect out-of-alignment or axial rub conditions. Thus, a proximity measurement system is able to predict mechanical failure in plant-critical machines to avoid costly downtime for heavy maintenance or even complete replacement of machines. One embodiment of the present invention is a system for identifying and managing the various components of a proximity measurement system using a color code and alphanumeric scheme.

In the specification and appended claims: (1) the terms "connected," "connecting", and "connection" are used to mean "in direct connection with" or "in connection with via another element"; (2) the term "set" is used to mean "one" or "more than one"; (3) the term "driver" is used to mean "an electronic driver", "a combination of an electronic driver and a signal conditioner", "an electronic transmitter", or "any electronic device which is used to produce a signal in proportion to the proximity measurements observed by the sensing tip of the proximity probe"; and (4) the term "type" is used to mean "a standardized series of probe, extension cable, or driver."

A description of certain embodiments of the present invention is provided to facilitate an understanding of the invention. This description is intended to be illustrative and not limiting of the present invention.

Figure 1:
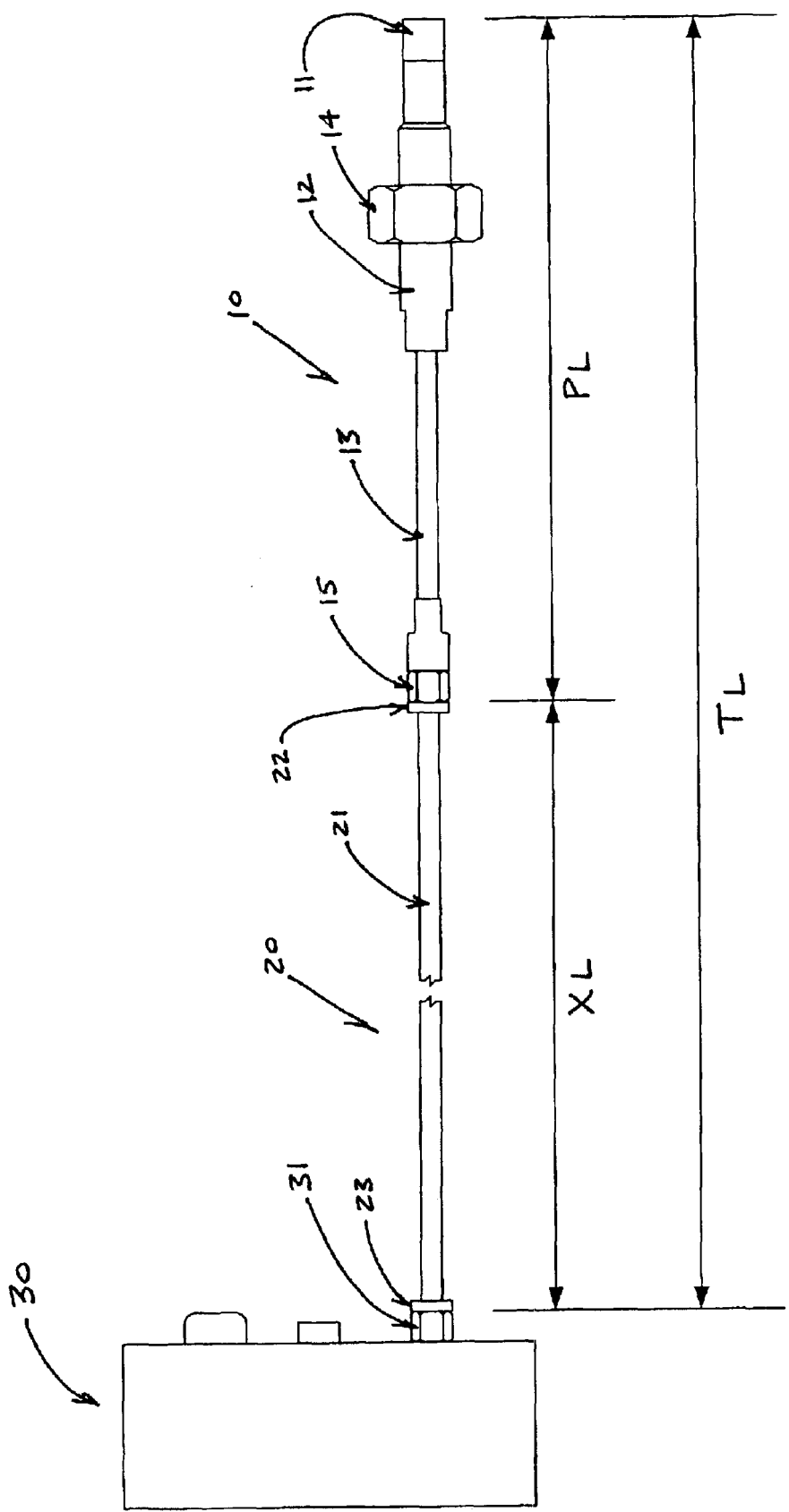
FIG. 1 is a profile view of a preferred embodiment of a proximity measurement system comprising a proximity probe, proximity probe extension cable, and a transmitter.

With respect to FIG. 1, the general components of a proximity measurement system in accordance with the present invention are illustrated. A proximity measurement system comprises at least three components: a proximity probe 10, an extension cable 20, and an electronic transmitter 30. Alternatively, an electronic driver (not shown) may be used in place of the transmitter 30.

The proximity probe 10 comprises a sensing tip 11, a probe body 12, a probe cable or "pigtail" 13, a connecting means 14 to attach the probe body to the bearing surface of a critical plant machine (not shown), and a connecting means 15 to connect the pigtail of the probe to an extension cable 20. The pigtail 13 is a cable having abrasion-resistant insulation. A fluoropolymer resin—such as DuPont's Tefzel (R)—may be used as an insulating material. The connecting means 14, 15 can be any conventional attaching apparatus including, but not limited to, a turning nut. The probe 10 has a predetermined length PL from the end of the connecting means 15 to the end of the sensing tip 11.

The probe extension cable 20 comprises a cable 21 having abrasion-resistant insulation, a connecting means 22 to connect the extension cable to the pigtail 13 of the proximity probe 10, and a connection means 23 to connect the extension cable to an electronic transmitter device 30. As with the pigtail 13 of the probe 10, a fluoropolymer resin such as DuPont's Tefzel (R) may be used as an insulating material for the cable 21. The connecting means 22, 23 can be any conventional attaching apparatus including, but not limited to, a threaded shaft. The extension cable 20 has a predetermined length XL from the end of the connecting means 22 to the end of the connecting means 23. The length PL of the probe 10 and the length XL of the extension cable 20 are combined to yield the total system length TL of the proximity measurement system.

The electronic transmitter 30 comprises a port 31 for connection with the extension cable 20. The port 31 can be any conventional attaching apparatus including, but not limited to, a turning nut. While the proximity measurement system of FIG. 1 is shown having an electronic transmitter, it is intended that the system can include an electronic driver instead.

For proper installation of these components of the proximity measurement system, the total system length TL of the probe 10 and the extension cable 20 must correspond with the appropriate transmitter 30. Also, the type or "series" of the probe 10 used in the proximity measurement system must be matched or tuned with the series of the extension cable 20 and the series of the transmitter 30.

With respect to FIGS. 2A–D, 3A–D, and 4A–D, an embodiment of the present invention includes a system employing color coded markers to indicate the particular series of the system components and alphanumeric labels to identify the length of a particular component.

The standard series of components of a proximity measurement system and the respective color codes are as follows:

| SERIES | COLOR CODE |
|--------|------------|
| 3000 | white |
| 3300 | baby blue |
| 7200 | light tan |
| RAM | light purple |

Figure 2A:
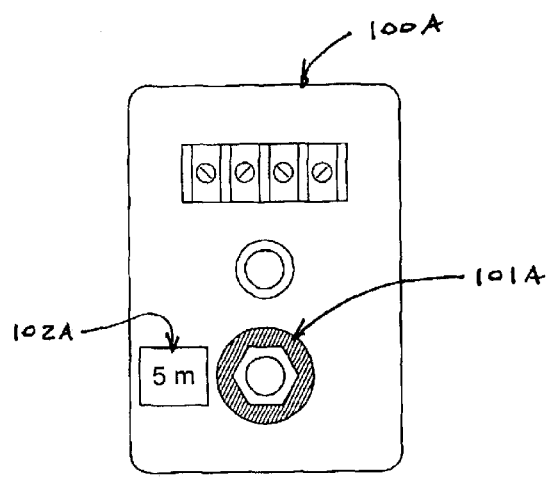
FIG. 2A is an enlarged frontal view of a transmitter device in accordance with the present invention for connection with a 7200 series proximity probe extension cable (FIG. 3A) and for use with a proximity measurement system having a total system length of 5 meters.
Figure 3A:
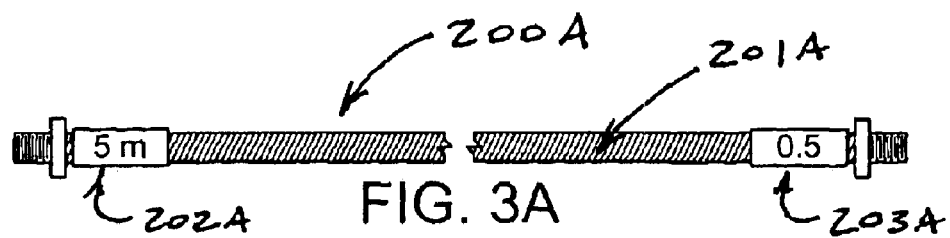
FIG. 3A is a profile view of a 7200 series proximity probe extension cable in accordance with the present invention for connection with a 7200 series proximity probe having a length of 0.5 meters (FIG. 4A) and for use with a proximity measurement system having a total system length of 5 meters.
Figure 4A:
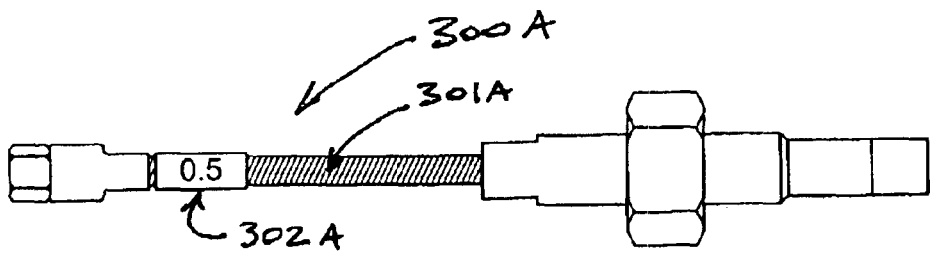
FIG. 4A is a profile view of a 7200 series proximity probe in accordance with the present invention having a length of 0.5 meters.

With respect to FIGS. 2A, 3A, 4A, a proximity measurement system (i.e., the transmitter 10A, the extension cable 200A, and the proximity probe 300A) of the "7200 series" with a total system length of 5 meters is depicted. As indicated in the table above, the color designation for the "7200 series" is "light tan." Accordingly, the transmitter 100A is marked with a "light tan" colored label 10A, and the insulation 201A of the extension cable 200A and the insulation 301A of the pigtail of the proximity probe 300A are both "light tan" in color. Moreover, the proximity measurement system includes an extension cable 200A having a length of 4.5 meters and a proximity probe 300A having a length of 0.5 meters. Accordingly, the transmitter 100A is marked with a label 102A depicting the system length "5 m"; the extension cable 200A is marked on one end with a label 202A depicting the system length "5 m" and on the other end with a label 203A depicting the proximity probe length in meters "0.5"; and the pigtail of the proximity probe 300A is marked with a label 302A depicting the proximity probe length in meters "0.5".

Figure 2B:
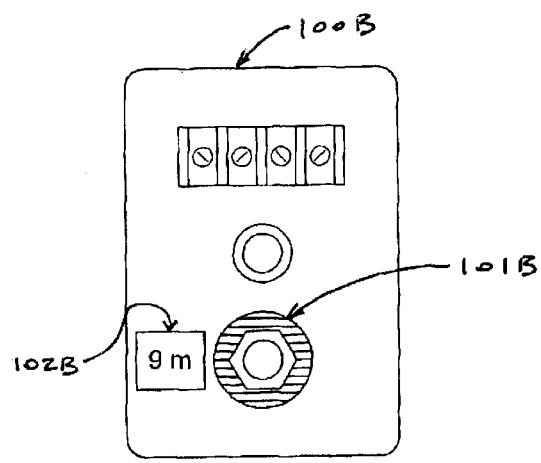
FIG. 2B is an enlarged frontal view of a transmitter device in accordance with the present invention for connection with a 3300 series proximity probe extension cable (FIG. 3B) and for use with a proximity measurement system having a total system length of 9 meters.
Figure 3B:
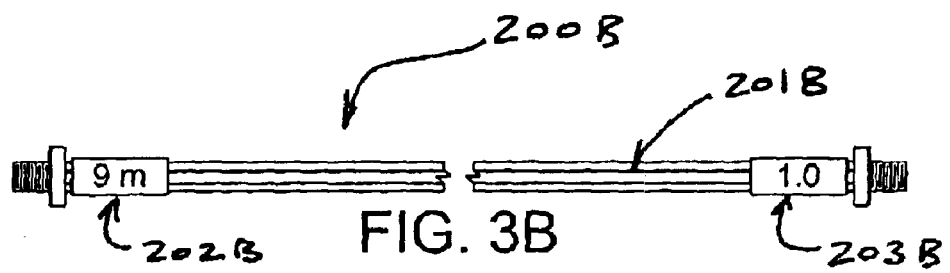
FIG. 3B is a profile view of a 3300 series proximity probe extension cable in accordance with the present invention for connection with a 3300 series proximity probe having a length of 1.0 meters (FIG. 4B) and for use with a proximity measurement system having a total system length of 9 meters.
Figure 4B:
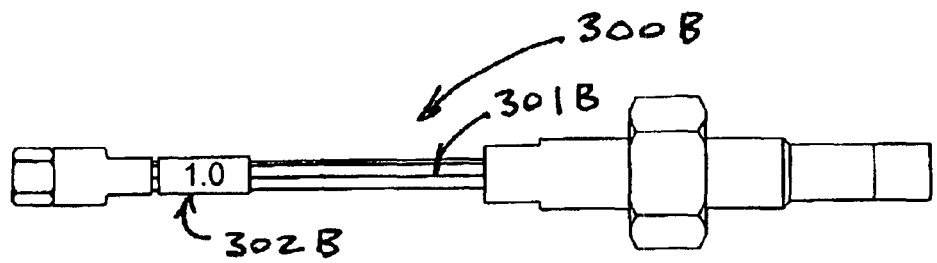
FIG. 4B is a profile view of a 3300 series proximity probe in accordance with the present invention having a length of 1.0 meters.

With respect to FIGS. 2B, 3B, 4B, a proximity measurement system (i.e., the transmitter 100B, the extension cable 200B, and the proximity probe 300B) of the "3300 series" with a total system length of 9 meters is depicted. As indicated in the table above, the color designation for the "3300 series" is "baby blue." Accordingly, the transmitter 100B is marked with a "baby blue" colored label 101B, and the insulation 201B of the extension cable 200B and the insulation 301B of the pigtail of the proximity probe 300B are both "baby blue" in color. Moreover, the proximity measurement system includes an extension cable 200B having a length of 8 meters and a proximity probe 300B having a length of 1.0 meters. Accordingly, the transmitter 100B is marked with a label 102B depicting the system length "9 m"; the extension 200B cable is marked on one end with a label 202B depicting the system length "9 m" and on the other end with a label 203B depicting the proximity probe length in meters "1.0"; and the pigtail of the proximity probe 300B is marked with a label 302B depicting the proximity probe length in meters "1.0".

Figure 2C:
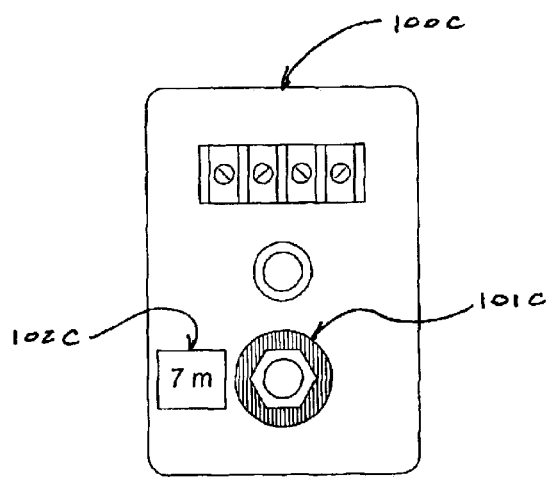
FIG. 2C is an enlarged frontal view of a transmitter device in accordance with the present invention for connection with a RAM series proximity probe extension cable (FIG. 3C) and for use with a proximity measurement system having a total system length of 7 meters.
Figure 3C:
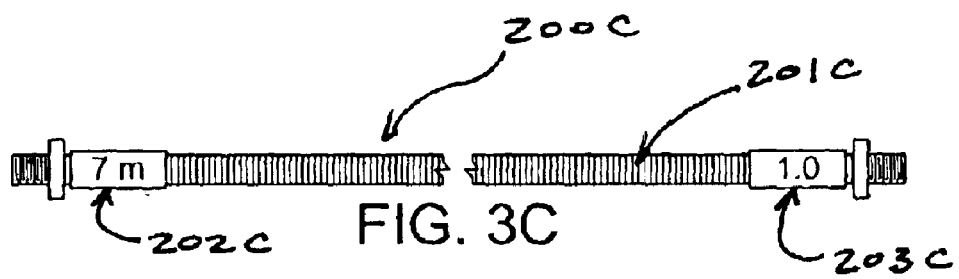
FIG. 3C is a profile view of a RAM series proximity probe extension cable in accordance with the present invention for connection with a RAM series proximity probe having a length of 1.0 meters (FIG. 4C) and for use with a proximity measurement system having a total system length of 7 meters.
Figure 4C:
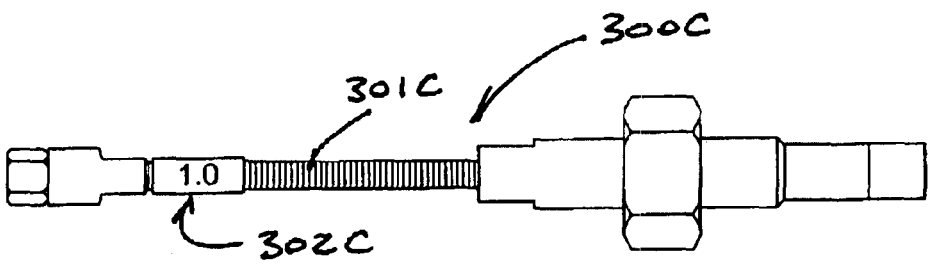
FIG. 4C is a profile view of a RAM series proximity probe in accordance with the present invention having a length of 1.0 meters.

With respect to FIGS. 2C, 3C, 4C, a proximity measurement system (i.e., the transmitter 100C, the extension cable 200C, and the proximity probe 300C) of the "RAM series" with a total system length of 7 meters is depicted. As indicated in the table above, the color designation for the "RAM series" is "light purple." Accordingly, the transmitter 100C is marked with a "light purple" colored label 101C, and the insulation 201C of the extension cable 200C and the insulation 301C of the pigtail of the proximity probe 300C are both "light purple" in color. Moreover, the proximity measurement system includes an extension cable 200C having a length of 6 meters and a proximity probe 300C having a length of 1.0 meters. Accordingly, the transmitter 100C is marked with a label 102C depicting the system length "7 m"; the extension 200C cable is marked on one end with a label 202C depicting the system length "7 m" and on the other end with a label 203C depicting the proximity probe length in meters "1.0"; and the pigtail of the proximity probe 300C is marked with a label 302C depicting the proximity probe length in meters "1.0".

Figure 2D:
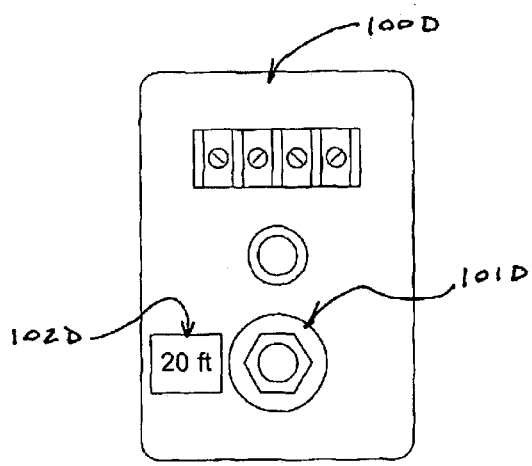
FIG. 2D is an enlarged frontal view of a transmitter device in accordance with the present invention for connection with a 3000 series proximity probe extension cable (FIG. 3D) and for use with a proximity measurement system having a total system length of 20 feet.
Figure 3D:
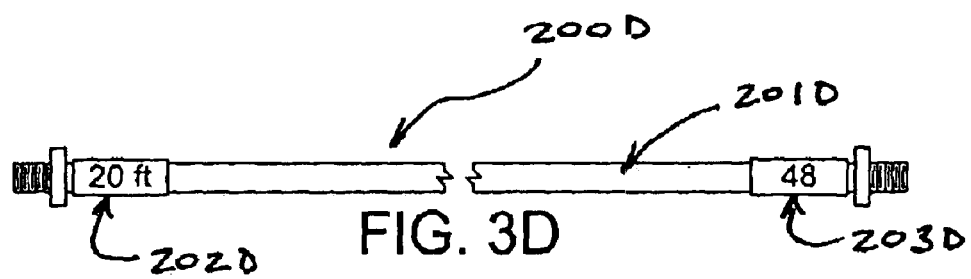
FIG. 3D is a profile view of a 3000 series proximity probe extension cable in accordance with the present invention for connection with a 3000 series proximity probe having a length of 48 inches (FIG. 4D) and for use with a proximity measurement system having a total system length of 20 feet.
Figure 4D:
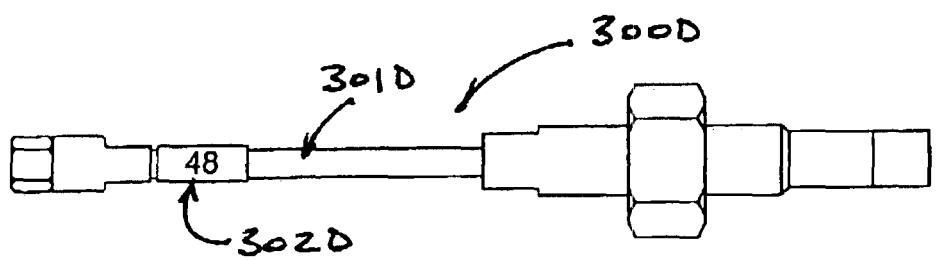
FIG. 4D is a profile view of a 3000 series proximity probe in accordance with the present invention having a length of 48 inches.

With respect to FIGS. 2D, 3D, 4D, a proximity measurement system (i.e., the transmitter 100D, the extension cable 200D, and the proximity probe 300D) of the "3000 series" with a total system length of 20 feet is depicted. As indicated in the table above, the color designation for the "3000 series" is "white." Accordingly, the transmitter 100D is marked with a "white" colored label 101D, and the insulation 201D of the extension cable 200D and the insulation 301D of the pigtail of the proximity probe 300D are both "white" in color. Moreover, the proximity measurement system includes an extension cable 200D having a length of 16 feet and a proximity probe 300D having a length of 48 inches. Accordingly, the transmitter 100D is marked with a label 102D depicting the system length "20 ft"; the extension 200D cable is marked on one end with a label 202D depicting the system length "20 ft" and on the other end with a label 203D depicting the proximity probe length in inches "48"; and the pigtail of the proximity probe 300D is marked with a label 302D depicting the proximity probe length in inches "48".

With respect to FIGS. 2A–D, 3A–D, and 4A–D, by matching the series of components (as indicated by the color coded markers) and the length of the components (as indicated by the alphanumeric labels), a tuned proximity measurement system can be more easily and reliably assembled than prior to the present invention.

It will be understood by those skilled in the art that a number of alternative color codes indicating these and other series of the components and alphanumeric labels indicating the length of the components may be employed in accordance with the present invention. However, this particular embodiment of the present invention is considered advantageous because it employs standard lengths and standard colors associated with proximity measurement components.

What is claimed is:

1. An identification system for managing components of a proximity measurement system including (i) a probe of a standardized type and having a predetermined length, (ii) an extension cable of a standardized type and having a predetermined length, and (iii) a driver of a standardized type, said identification system comprising:

color coded indicators for identifying the type of the probe, the type of the extension cable, and the type of the driver; and alphanumeric indicators for identifying the predetermined length of the probe and the predetermined length of the extension cable.

2. The identification system of claim 1 wherein the proximity measurement system has a total system length equal to the sum of the predetermined length of the probe and the predetermined length of the extension cable.

3. The identification system of claim 2 wherein the color coded indicators are (i) colored cable insulators attached to the probe, (ii) colored cable insulators attached to the extension cable, and (iii) a colored label attached to the driver.

4. The identification system of claim 3 wherein the alphanumeric indicators are (i) an alphanumeric label attached to the probe depicting the predetermined length of the probe, (ii) an alphanumeric label attached to the extension cable depicting the predetermined length of the probe, (iii) an alphanumeric label attached to the extension cable depicting the total system length of the proximity measurement system, and (iv) an alphanumeric label attached to the driver depicting the total system length of the proximity measurement system.

5. A set of proximity measurement systems, each system having a predetermined total system length and being a standardized type comprising:

a probe having a predetermined length, said probe comprising: (i) a color coded cable insulator for indicating the type of the proximity measurement system; and (ii) an alphanumeric label attached to the probe for indicating the predetermined length of the probe;

an extension cable having a predetermined length, said extension cable comprising: (i) a color coded cable insulator for indicating the type of the proximity measurement system; (ii) an alphanumeric label attached to the extension cable for indicating the predetermined length of the probe; and (iii) an alphanumeric label attached to the extension cable for indicating the predetermined total system length of the proximity measurement system; and a driver comprising: (i) a color coded label attached to the driver for indicating the type of the proximity measurement system; and (ii) an alphanumeric label attached to the driver for indicating the predetermined total system length of the proximity measurement system.

* * * * *